United States Patent
Khalili et al.

(10) Patent No.: US 9,444,473 B2
(45) Date of Patent: Sep. 13, 2016

(54) INCREASED SYNTHESIZER PERFORMANCE IN CARRIER AGGREGATION/MULTIPLE-INPUT, MULTIPLE-OUTPUT SYSTEMS

(71) Applicant: QUALCOMM Incorporated, San Diego, CA (US)

(72) Inventors: Alireza Khalili, Sunnyvale, CA (US); Mazhareddin Taghivand, Campbell, CA (US); Arvind Keerti, Fremont, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 14/548,705

(22) Filed: Nov. 20, 2014

(65) Prior Publication Data

US 2016/0072512 A1 Mar. 10, 2016

Related U.S. Application Data

(60) Provisional application No. 62/048,124, filed on Sep. 9, 2014.

(51) Int. Cl.
*H03L 7/099* (2006.01)
*H03B 5/12* (2006.01)
*H04B 1/00* (2006.01)

(52) U.S. Cl.
CPC ............ *H03L 7/099* (2013.01); *H03B 5/1212* (2013.01); *H04B 1/005* (2013.01); *H04B 1/0064* (2013.01)

(58) Field of Classification Search
CPC ........................................................ H03L 7/099

USPC ........................................................ 331/2, 56
See application file for complete search history.

(56) References Cited

U.S. PATENT DOCUMENTS

| | | | |
|---|---|---|---|
| 4,282,493 A | * 8/1981 | Moreau | G06F 11/1604 327/292 |
| 2003/0224747 A1 | 12/2003 | Anand | |
| 2008/0136531 A1* | 6/2008 | Kim | H03L 7/0895 331/2 |
| 2013/0230080 A1 | 9/2013 | Gudem et al. | |
| 2014/0072001 A1 | 3/2014 | Chang et al. | |
| 2014/0203881 A1 | 7/2014 | Lu et al. | |
| 2014/0225458 A1 | 8/2014 | Rehm | |
| 2014/0241335 A1 | 8/2014 | Chen et al. | |
| 2014/0266479 A1 | 9/2014 | Rong et al. | |

OTHER PUBLICATIONS

Danfeng C., et al., "A low-spurious fast-hopping MB-OFDM UWB synthesizer," Journal of Semiconductors, Jun. 2010, vol. 31 (6), pp. 065003-1 to 065003-5.
International Search Report and Written Opinion—PCT/US2015/044629—ISA/EPO—Nov. 27, 2015.

* cited by examiner

*Primary Examiner* — Joseph Chang
(74) *Attorney, Agent, or Firm* — Patterson & Sheridan, L.L.P.

(57) ABSTRACT

Certain aspects of the present disclosure provide methods and apparatus for using multiple voltage-controlled oscillators (VCOs) to increase frequency synthesizer performance, such as in stringent multiple-input, multiple-output (MIMO) modes. One example apparatus capable of generating oscillating signals generally includes a first VCO, a second VCO, and connection circuitry configured to connect the second VCO in parallel with the first VCO if a phase-locked loop (PLL) associated with the second VCO is idle.

24 Claims, 5 Drawing Sheets

INCREASED SYNTHESIZER PERFORMANCE IN CARRIER AGGREGATION/MULTIPLE-INPUT, MULTIPLE-OUTPUT SYSTEMS

CLAIM OF PRIORITY UNDER 35 U.S.C. §119

This application claims benefit of U.S. Provisional Patent Application Ser. No. 62/048,124, filed Sep. 9, 2014, which is herein incorporated by reference in its entirety.

TECHNICAL FIELD

Certain aspects of the present disclosure generally relate to radio frequency (RF) circuits and, more particularly, to using multiple voltage-controlled oscillators (VCOs) in parallel to increase frequency synthesizer performance.

BACKGROUND

Wireless communication networks are widely deployed to provide various communication services such as telephony, video, data, messaging, broadcasts, and so on. Such networks, which are usually multiple access networks, support communications for multiple users by sharing the available network resources. For example, one network may be a 3G (the third generation of mobile phone standards and technology) system, which may provide network service via any one of various 3G radio access technologies (RATs) including EVDO (Evolution-Data Optimized), 1xRTT (1 times Radio Transmission Technology, or simply 1x), W-CDMA (Wideband Code Division Multiple Access), UMTS-TDD (Universal Mobile Telecommunications System-Time Division Duplexing), HSPA (High Speed Packet Access), GPRS (General Packet Radio Service), or EDGE (Enhanced Data rates for Global Evolution). The 3G network is a wide area cellular telephone network that evolved to incorporate high-speed internet access and video telephony, in addition to voice calls. Furthermore, a 3G network may be more established and provide larger coverage areas than other network systems. Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, $3^{rd}$ Generation Partnership Project (3GPP) Long Term Evolution (LTE) networks, and Long Term Evolution Advanced (LTE-A) networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

SUMMARY

Certain aspects of the present disclosure generally relate to using multiple voltage-controlled oscillators (VCOs) in parallel to increase frequency synthesizer performance in particular operation modes.

Certain aspects of the present disclosure provide a method for generating oscillating signals. The method generally includes generating a first oscillating signal from a first voltage-controlled oscillator (VCO) and connecting a second VCO in parallel with the first VCO if a phase-locked loop (PLL) associated with the second VCO is idle.

Certain aspects of the present disclosure provide an apparatus capable of generating oscillating signals. The apparatus generally includes a first voltage-controlled oscillator (VCO), a second VCO, a phase-locked loop (PLL) associated with the second VCO, and connection circuitry configured to connect the second VCO in parallel with the first VCO if the PLL associated with the second VCO is idle.

According to certain aspects, the second VCO is configured to operate with the same oscillating frequency as the first VCO.

According to certain aspects, the connection circuitry includes one or more switches between the first VCO and the second VCO. The switches may comprise a T switch having a first branch and a second branch. The second branch may be connected between a node of the first branch and an electrical ground for at least one of the first VCO or the second VCO. In this case, the connection circuitry may be configured to connect the second VCO in parallel with the first VCO by closing at least one switch in the first branch and opening at least one switch in the second branch.

In certain aspects, the connection circuitry is further configured to disconnect the second VCO from the first VCO. In certain aspects, at least a portion of the PLL associated with the second VCO may be powered on after the second VCO is disconnected from the first VCO. In certain aspects, the connection circuitry includes one or more switches between the first VCO and the second VCO. The switches may comprise a T switch having a first branch and a second branch, and the second branch may be connected between a node of the first branch and an electrical ground for at least one of the first VCO or the second VCO. In this case, the connection circuitry may be configured to disconnect the second VCO from the first VCO by opening at least one switch in the first branch and closing at least one switch in the second branch. In certain aspects, the PLL associated with the second VCO is active in a carrier aggregation (CA) mode for the apparatus, and the second VCO is disconnected from the first VCO in the CA mode.

According to certain aspects, the PLL associated with the second VCO is idle in a multiple-input, multiple-output (MIMO) mode for the apparatus, and the second VCO is connected with the first VCO in the MIMO mode.

According to certain aspects, a portion of the PLL associated with the second VCO may be powered off before the second VCO is connected with the first VCO. In certain aspects, the apparatus further includes a PLL associated with the first VCO, which may be used when the second VCO is connected with the first VCO.

According to certain aspects, after the second VCO is connected with the first VCO, a first oscillating signal generated by the first VCO and a second oscillating signal generated by the second VCO are injection locked together.

According to certain aspects, the first VCO includes a first tank circuit and a first active negative transconductance circuit, and the second VCO includes a second tank circuit and a second active negative transconductance circuit. The first tank circuit is different from the second tank circuit. The first active negative transconductance circuit is different from the second active negative transconductance circuit.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the present disclosure are described below. It should be apparent that the teachings herein may be embodied in a wide variety of forms and that any specific structure, function, or both being disclosed herein is merely representative. Based on the teachings herein, one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. Furthermore, an aspect may comprise at least one element of a claim.

The word "exemplary" is used herein to mean "serving as an example, instance, or illustration." Any aspect described herein as "exemplary" is not necessarily to be construed as preferred or advantageous over other aspects.

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE) (e.g., in TDD and/or FDD modes), or some other standards. A TDMA system may implement Global System for Mobile Communications (GSM) or some other standards. These various standards are known in the art.

An Example Wireless System

Figure 1:
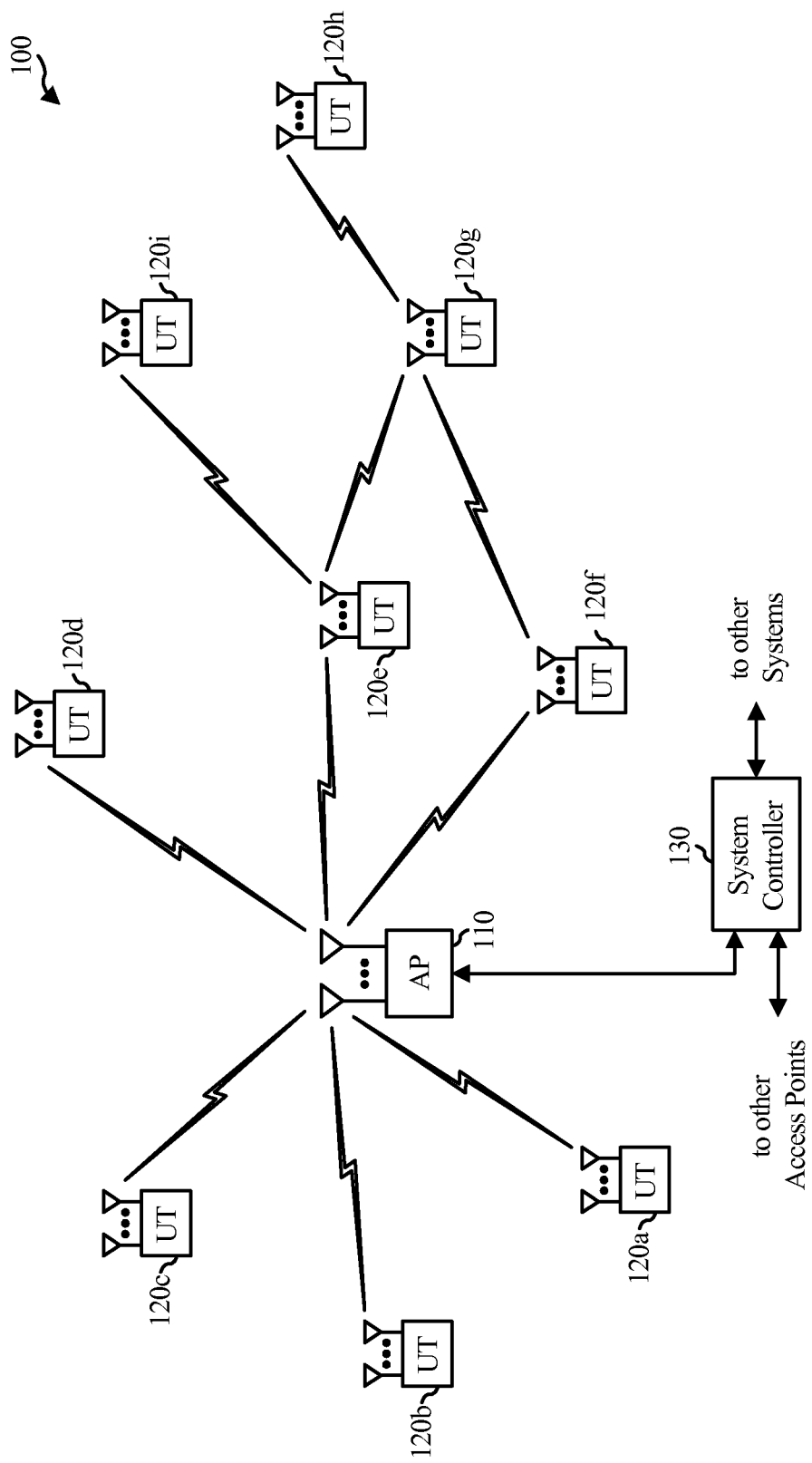
FIG. 1 is a diagram of an example wireless communications network in accordance with certain aspects of the present disclosure.

FIG. 1 illustrates a wireless communications system 100 with access points and user terminals. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal may be equipped with a single antenna (e.g., in order to keep costs down) or multiple antennas (e.g., where the additional cost can be supported).

Figure 2:
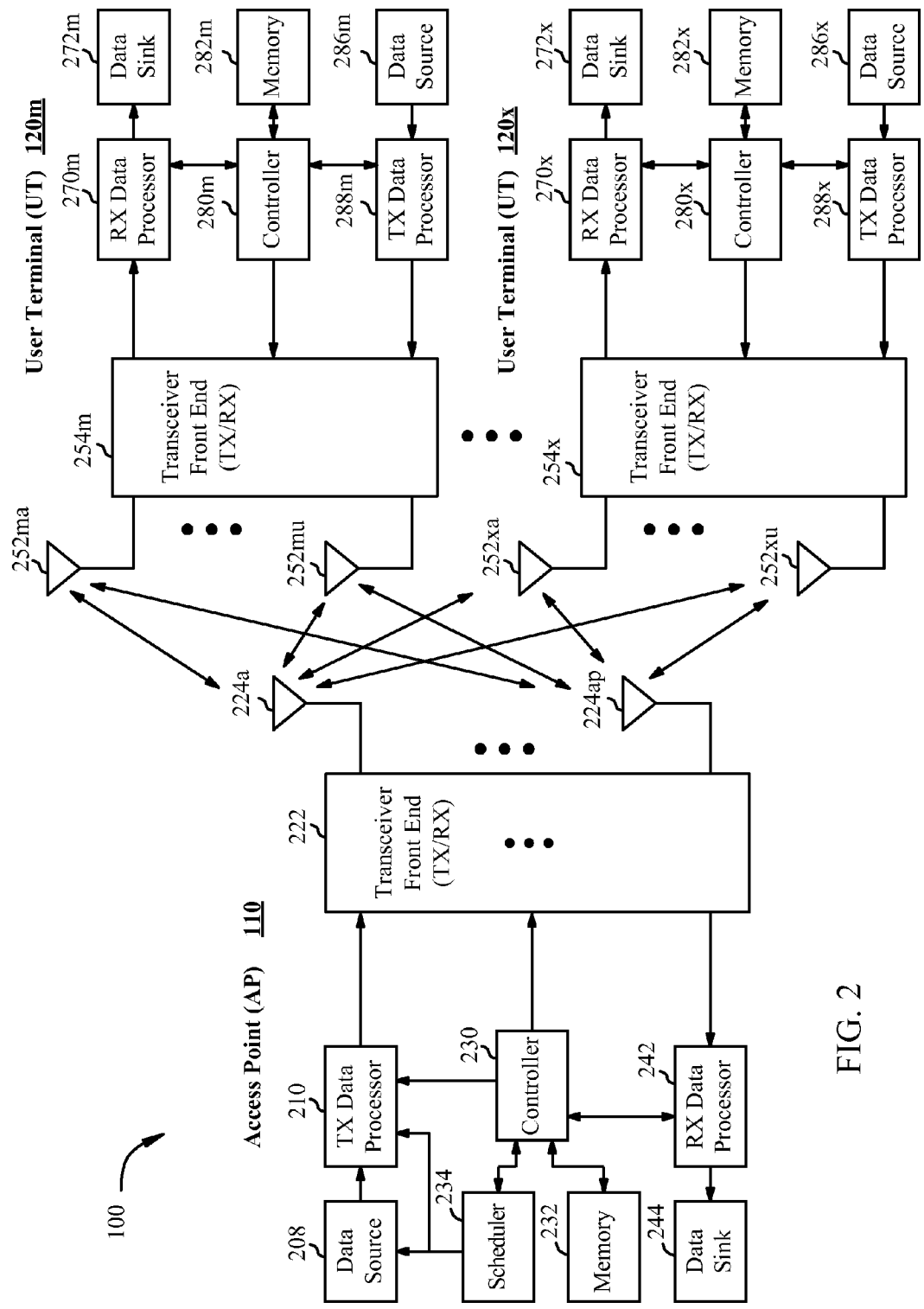
FIG. 2 is a block diagram of an example access point (AP) and example user terminals in accordance with certain aspects of the present disclosure.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,x}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. For certain aspects of the present disclosure, a combination of the signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230

At each user terminal 120, $N_{ut,m}$ antennas 252 receive the downlink signals from access point 110. For receive diversity at the user terminal 120, the transceiver front end 254 may select signals received from one of the antennas 252 for processing. For certain aspects of the present disclosure, a combination of the signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, TD-SCDMA, and combinations thereof.

Figure 3:
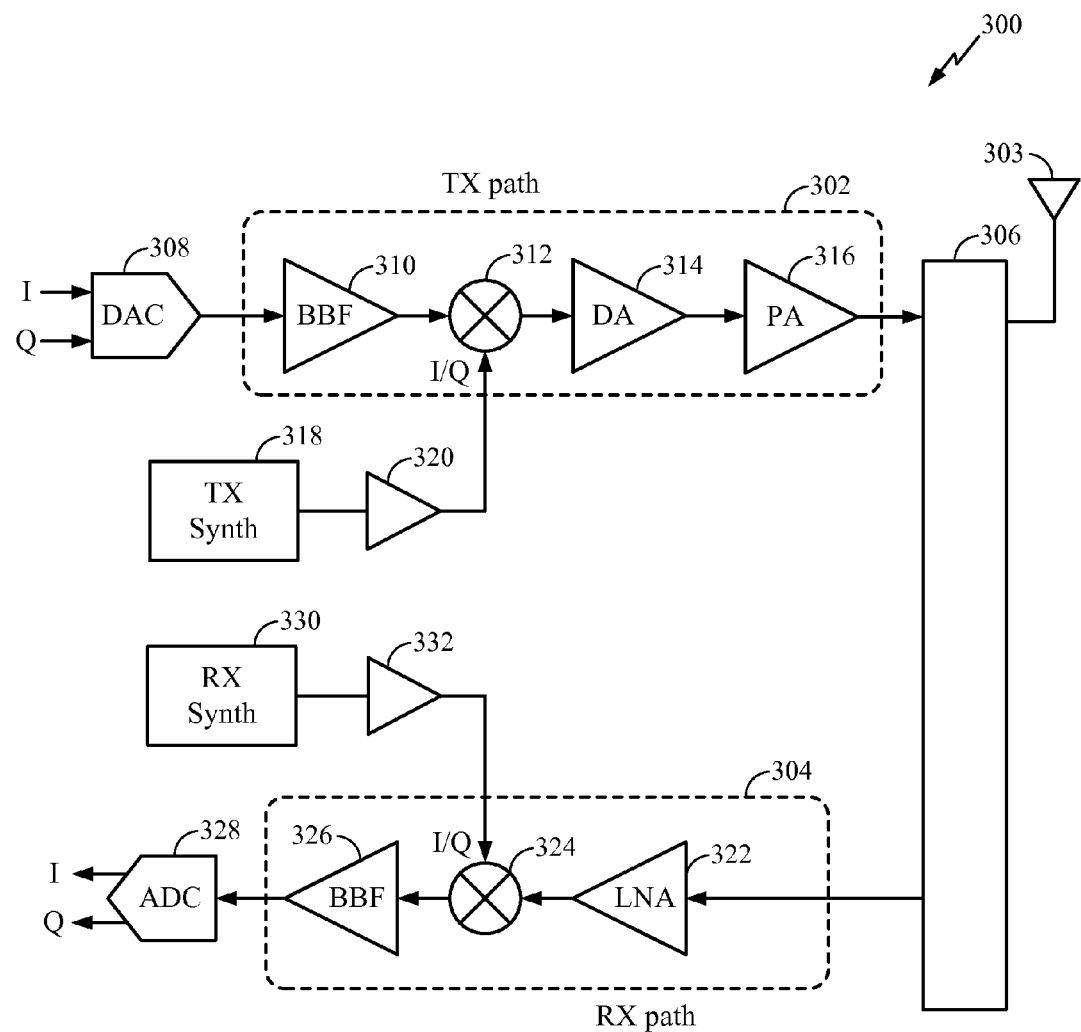
FIG. 3 is a block diagram of an example transceiver front end in accordance with certain aspects of the present disclosure.

FIG. 3 is a block diagram of an example transceiver front end 300, such as transceiver front ends 222, 254 in FIG. 2, in accordance with certain aspects of the present disclosure. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier 316. The BBF 310, the mixer 312, and the DA 314 may be included in a radio frequency integrated circuit (RFIC), while the PA 316 is often external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). Known as heterodyning, this frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which are amplified by the DA 314 and by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning to different frequencies indicates using a variable-frequency oscillator, which involves compromises between stability and tunability. Contemporary systems employ frequency synthesizers with a voltage-controlled oscillator (VCO) to generate a stable, tunable LO with a particular tuning range. Thus, the transmit LO is typically produced by a TX frequency synthesizer 318, which may be buffered or amplified by amplifier 320 before being mixed with the baseband signals in the mixer 312. Similarly, the receive LO is typically produced by an RX frequency synthesizer 330, which may be buffered or amplified by amplifier 332 before being mixed with the RF signals in the mixer 324.

Example Oscillating Signal Generator

Multiple antenna systems are widely used in RF systems to provide diversity and beam-forming capabilities. Such multiple antenna systems typically demand significantly lower noise levels compared to single-antenna systems, which complicates the frequency synthesizer and TX chain designs. For the synthesizer, reduced phase noise is desired. Typically the synthesizer is over-designed to cover modes with these capabilities, thereby creating a substantial area and power penalty.

Figure 4:
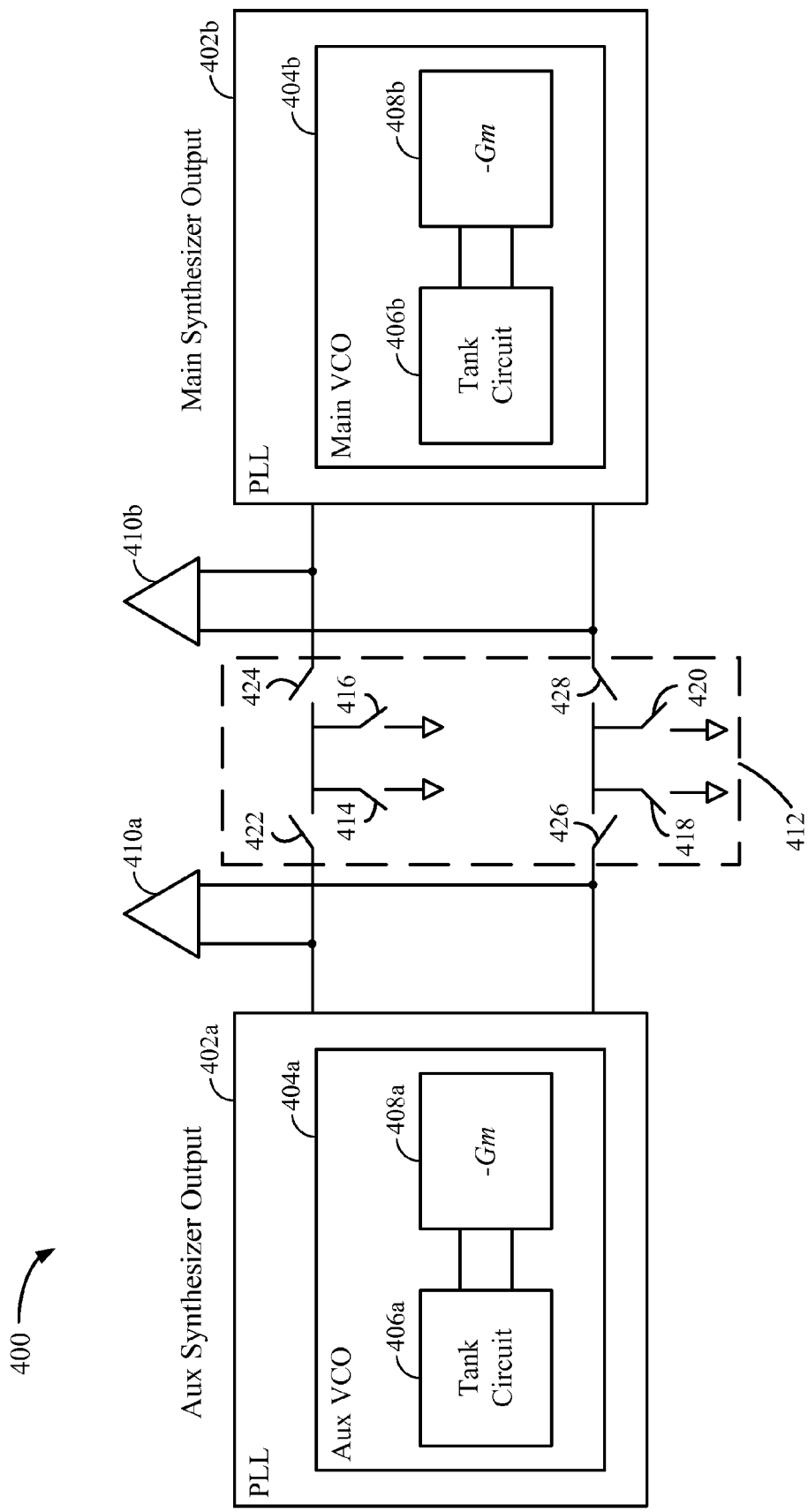
FIG. 4 illustrates a main voltage-controlled oscillator (VCO) and an auxiliary VCO selectively connected and disconnected by a plurality of switches, in accordance with certain aspects of the present disclosure.

In many wireless systems an auxiliary VCO is used to support carrier aggregation (CA) in the same band as the main VCO (e.g., 80+80 mode). FIG. 4 illustrates an example oscillating signal generator 400, which may be included in the TX synthesizer 318 or RX synthesizer 330, for example. The example oscillating signal generator 400 comprises a plurality of phase-locked loops (PLLs) 402a, 402b (collectively "PLLs 402") each having a VCO (e.g., an auxiliary VCO 404a and a main VCO 404b, collectively "VCOs 404"). Each of the VCOs 404 may comprise a tank circuit 406 (e.g., an LC tank circuit) and a negative transconductance (−Gm) circuit 408 (comprising cross-coupled transistors, for example). In other words, the auxiliary VCO 404a operates independently from the main VCO 404b, each VCO having its own tank circuit 406a, 406b and negative transconductance circuit 408a, 408b. The output of each PLL 402a, 402b may be connected to a respective buffer 410a, 410b (collectively "buffers 410").

Certain aspects of the present disclosure provide methods and apparatus for using the auxiliary VCO 404a in conjunction with the main VCO 404b to increase the performance in non-CA modes, such as WV MIMO modes, while keeping the normal modes intact. To accomplish this, the outputs of the VCOs 404 (e.g., the differential voltage-controlled oscillating signal lines) may be connected through connection circuitry 412, which may be composed of a plurality of switches. In the normal modes, the main and auxiliary VCOs 404b, 404a are independently functioning in two separate PLLs 402b, 402a. However, the differential outputs of these two VCOs 404 are connected together by two "T" switches in the connection circuitry 412, for example.

A T switch may be considered to have one or more horizontal branches and one or more vertical branches intersecting at least one of the horizontal branches, thereby conceptually forming a "T" shape. In the example of FIG. 4, the horizontal branch of a first T switch in the connection circuitry 412 includes switches 422 and 424, and the vertical branch of the first T switch includes switches 414 and 416. The horizontal branch of a second T switch includes switches 426 and 428, and the vertical branch of the second T switch includes switches 418 and 420. Although FIG. 4 illustrates two vertical switches (e.g., switches 414 and 416) to ground for each trace in the differential VCO output signal pair, in certain aspects, either or both traces of the differential signal pair may have a single vertical switch or more than two switches to ground. Likewise, the horizontal branch of a T switch may have a single horizontal switch or more than two switches in series.

In the normal modes (e.g., a CA mode), the horizontal branches of the T switches are open, and the center nodes in the horizontal branches are grounded (by closing the vertical branches of the T switches), in an effort to isolate the VCOs. In other words, in normal mode, switches 422, 424, 426, and 428 are open, while switches 414, 416, 418, and 420 are closed. In a MIMO mode, the auxiliary synthesizer (e.g., the remaining portion of the auxiliary PLL 402a) is powered off, and the VCOs 404 (more specifically, the differential outputs of the VCOs) are connected in parallel (horizontal switches 422, 424, 426, and 428 are closed and vertical switches 414, 416, 418, and 420 are opened) in an effort to boost the signal-to-noise ratio (SNR). As used herein, two VCOs connected "in parallel" generally refers to the output of the two VCOs being connected together.

In a situation where two oscillators are located close together and operate at nearby frequencies, the frequency of one oscillator may become locked with the frequency of the other if the coupling is sufficiently strong and the frequencies are near enough. The two oscillators are then referred to as being "injection locked." When the VCOs 404a and 404b are connected in parallel, the oscillating signals generated by the two VCOs may become injection locked together. When this happens, the magnitude of the oscillating signal generated by the two VCOs may increase by 6 dB, but the noise may increase by only 3 dB. In other words, if the oscillating signal generated by the auxiliary VCO 404a is at the same frequency as that generated by the main VCO 404b, strong coupling (through switches) may result in a paired VCO architecture that achieves an improvement of 3 dB phase noise (PN) performance (at 2× the current) for MIMO modes. If the VCO designs are different, the LO signal may be added together in the same fashion to provide the SNR benefit. The signals add constructively (6 dB gain), while uncorrelated VCO and charge pump (CP) noise increases by only 3 dB, providing up to a 3 dB reduction in PN. The LOs should typically be in phase, so the same reference and divider phase reset may most likely be used.

The expression for phase noise (L) is $$L(\Delta f) = 10\log\left(\frac{2kTF}{P} * \left(\frac{f_0}{2Q\Delta f}\right)^2\right)$$

in units of dBc/Hz, where $\Delta f$ is the frequency offset to the oscillating frequency, k is the Boltzmann constant, T is the temperature in Kelvin, F is the noise factor of the circuit, P is the average power through the resonator in watts, $f_0$ is the oscillating frequency in Hz, and Q is the quality factor of the VCO's tank circuit. Based on the above equation, reducing L by a factor of 2 results in a 3 dB reduction in phase noise.

Figure 5:
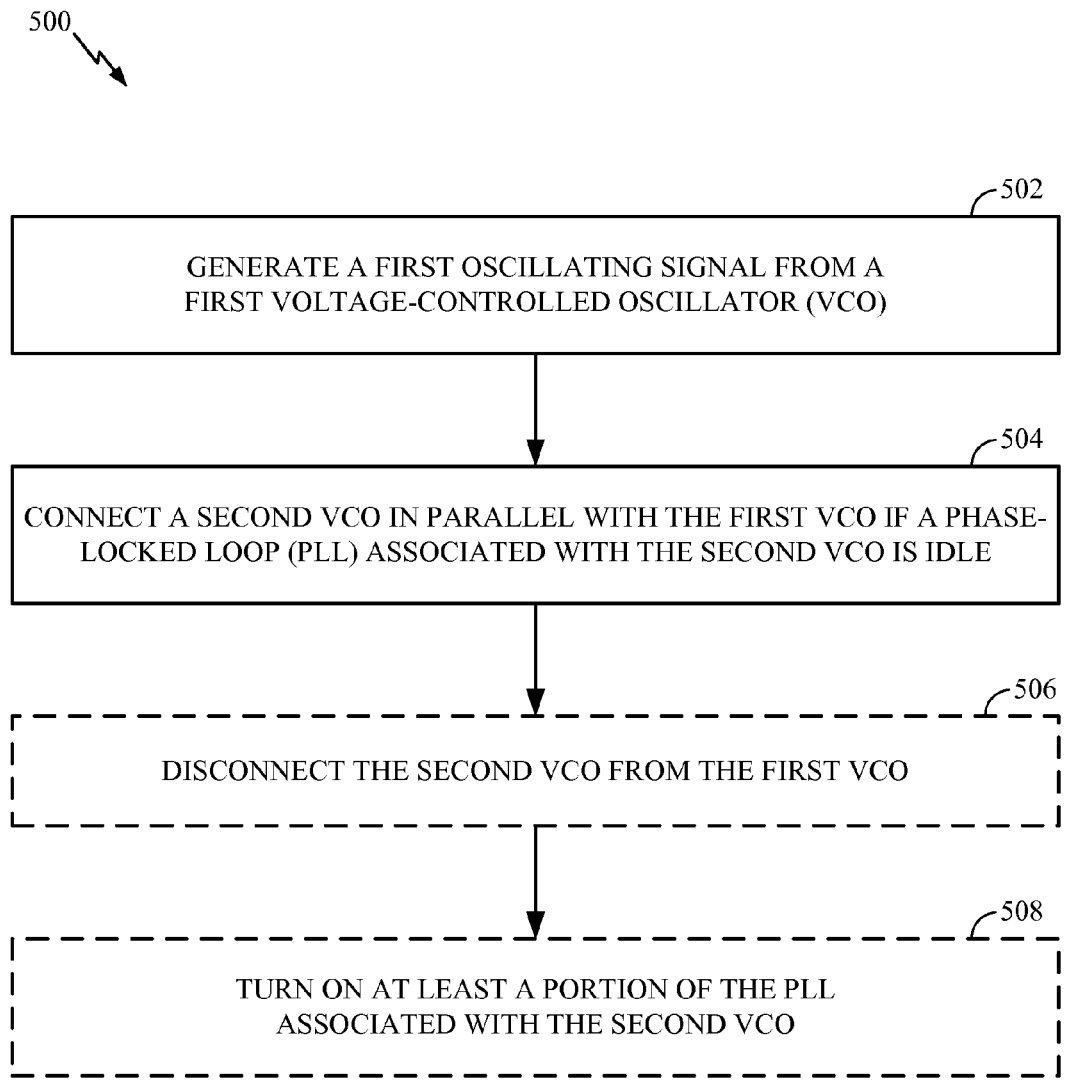
FIG. 5 illustrates example operations for generating an oscillating signal, in accordance with certain aspects of the present disclosure.

FIG. 5 illustrates example operations 500 for generating oscillating signals, in accordance with aspects of the present disclosure. The operations 500 may begin, at block 502, by generating a first oscillating signal from a first voltage-controlled oscillator (VCO) (e.g., a main VCO 404b). At block 504, a second VCO (e.g., an auxiliary VCO 404a) may be connected in parallel with the first VCO (e.g., the outputs of the first and second VCOs may be connected together) if a phase-locked loop (PLL) (e.g., PLL 402a) associated with the second VCO is idle. In certain aspects, the PLL associated with the second VCO is idle in a multiple-input, multiple-output (MIMO) mode for the apparatus, and the second VCO is connected with the first VCO in the MIMO mode.

According to certain aspects, the second VCO is configured to operate with the same oscillating frequency as the first VCO.

According to certain aspects, the connecting at block 504 involves closing one or more switches connected between the first VCO and the second VCO. In certain aspects, the switches comprise a T switch having a first branch and a second branch. The second branch may be connected between a node of the first branch and an electrical ground for at least one of the first VCO or the second VCO. In this case, closing the switches includes closing at least one switch in the first branch and opening at least one switch in the second branch.

According to certain aspects, the operations 500 further entail disconnecting the second VCO from the first VCO at block 506. In this case, the operations 500 may further include turning on (e.g., powering on) at least a portion of the PLL associated with the second VCO at block 508, after the disconnecting at block 506. In certain aspects, the disconnecting at block 506 involves opening one or more switches connected between the first VCO and the second VCO. The switches may comprise a T switch having a first branch and a second branch. The second branch may be connected between a node of the first branch and an electrical ground for at least one of the first VCO or the second VCO. In this case, opening the switches includes opening at least one switch in the first branch and closing at least one switch in the second branch. In certain aspects, the PLL associated with the second VCO is active in a carrier aggregation (CA) mode for the apparatus, and the second VCO is disconnected from the first VCO in the CA mode.

According to certain aspects, the operations 500 further include turning off (e.g., powering down) a portion of the PLL associated with the second VCO before the connecting at block 504. In this case, the operations 500 may further involve using a PLL associated with the first VCO.

According to certain aspects, after the connecting at block 504, the first oscillating signal generated by the first VCO and a second oscillating signal generated by the second VCO are injection locked together.

According to certain aspects, the first VCO includes a first tank circuit and a first active negative transconductance circuit, and the second VCO comprises a second tank circuit and a second active negative transconductance circuit. For certain aspects, the first tank circuit is different from the second tank circuit. For certain aspects, the first active negative transconductance circuit is different from the second active negative transconductance circuit.

The various operations or methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

For example, means for transmitting may comprise a transmitter (e.g., the transceiver front end 254 of the user terminal 120 depicted in FIG. 2 or the transceiver front end 222 of the access point 110 shown in FIG. 2) and/or an antenna (e.g., the antennas 252ma through 252mu of the user terminal 120m portrayed in FIG. 2 or the antennas 224a through 224ap of the access point 110 illustrated in FIG. 2). Means for receiving may comprise a receiver (e.g., the transceiver front end 254 of the user terminal 120 depicted in FIG. 2 or the transceiver front end 222 of the access point 110 shown in FIG. 2) and/or an antenna (e.g., the antennas 252ma through 252mu of the user terminal 120m portrayed in FIG. 2 or the antennas 224a through 224ap of the access point 110 illustrated in FIG. 2). Means for processing or means for determining may comprise a processing system, which may include one or more processors, such as the RX data processor 270, the TX data processor 288, and/or the controller 280 of the user terminal 120 illustrated in FIG. 2. Means for connecting may comprise connection circuitry, which may include one or more switches in any suitable configuration, such as the T switches in the connection circuitry 412 of FIG. 4. Means for generating an oscillating signal may comprise a voltage-controlled oscillator, such as the main VCO 404b of FIG. 4.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

As used herein, a phrase referring to "at least one of" a list of items refers to any combination of those items, including single members. As an example, "at least one of: a, b, or c" is intended to cover: a, b, c, a-b, a-c, b-c, a-b-c, and any combination thereof.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a user terminal 120 (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC (Application Specific Integrated Circuit) with the processor, the bus interface, the user interface in the case of an access terminal), supporting circuitry, and at least a portion of the machine-readable media integrated into a single chip, or with one or more FPGAs (Field Programmable Gate Arrays), PLDs (Programmable Logic Devices), controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. A method for generating oscillating signals, comprising:
   outputting a first oscillating signal from a first voltage-controlled oscillator (VCO); and
   connecting a second VCO in parallel with the first VCO if a phase-locked loop (PLL) associated with the second VCO is idle, wherein the second VCO is configured to operate with a same oscillating frequency as the first VCO, and wherein after the connecting, the first oscillating signal generated by the first VCO and a second oscillating signal generated by the second VCO are injection locked together.

2. The method of claim 1, wherein the connecting comprises closing one or more switches connected between the first VCO and the second VCO.

3. The method of claim 2, wherein the switches comprise a T switch having a first branch and a second branch, wherein the second branch is connected between a node of the first branch and an electrical ground for at least one of the first VCO or the second VCO, and wherein closing the switches comprises:
   closing at least one switch in the first branch; and
   opening at least one switch in the second branch.

4. The method of claim 1, further comprising disconnecting the second VCO from the first VCO.

5. The method of claim 4, further comprising turning on at least a portion of the PLL associated with the second VCO after the disconnecting.

6. The method of claim 4, wherein the disconnecting comprises opening one or more switches connected between the first VCO and the second VCO.

7. The method of claim 6, wherein the switches comprise a T switch having a first branch and a second branch, wherein the second branch is connected between a node of the first branch and an electrical ground for at least one of the first VCO or the second VCO, and wherein opening the switches comprises:
   opening at least one switch in the first branch; and
   closing at least one switch in the second branch.

8. The method of claim 4, wherein the PLL associated with the second VCO is active in a carrier aggregation (CA) mode for the apparatus and wherein the second VCO is disconnected from the first VCO in the CA mode.

9. The method of claim 1, wherein the PLL associated with the second VCO is idle in a multiple-input, multiple-output (MIMO) mode for the apparatus and wherein the second VCO is connected with the first VCO in the MIMO mode.

10. The method of claim 1, further comprising turning off a portion of the PLL associated with the second VCO before the connecting.

11. The method of claim 10, further comprising using a PLL associated with the first VCO.

12. The method of claim 1, wherein the first VCO comprises a first tank circuit and a first active negative transconductance circuit, wherein the second VCO comprises a second tank circuit and a second active negative transconductance circuit, and wherein the first tank circuit is different from the second tank circuit.

13. An apparatus capable of generating oscillating signals, comprising:
   a first voltage-controlled oscillator (VCO);
   a second VCO;
   a phase-locked loop (PLL) associated with the second VCO; and
   connection circuitry configured to connect the second VCO in parallel with the first VCO if the PLL associated with the second VCO is idle, wherein the second VCO is configured to operate with a same oscillating frequency as the first VCO, wherein after the second VCO is connected with the first VCO, a first oscillating signal generated by the first VCO and a second oscillating signal generated by the second VCO are injection locked together.

14. The apparatus of claim 13, wherein the connection circuitry comprises one or more switches between the first VCO and the second VCO.

15. The apparatus of claim 14, wherein the switches comprise a T switch having a first branch and a second branch, wherein the second branch is connected between a node of the first branch and an electrical ground for at least one of the first VCO or the second VCO, and wherein the connection circuitry is configured to connect the second VCO in parallel with the first VCO by:
   closing at least one switch in the first branch; and
   opening at least one switch in the second branch.

16. The apparatus of claim 13, wherein the connection circuitry is further configured to disconnect the second VCO from the first VCO.

17. The apparatus of claim 16, wherein at least a portion of the PLL associated with the second VCO is powered on after the second VCO is disconnected from the first VCO.

18. The apparatus of claim 16, wherein the connection circuitry comprises one or more switches between the first VCO and the second VCO.

19. The apparatus of claim 18, wherein the switches comprise a T switch having a first branch and a second branch, wherein the second branch is connected between a node of the first branch and an electrical ground for at least one of the first VCO or the second VCO, and wherein the connection circuitry is configured to disconnect the second VCO from the first VCO by:

opening at least one switch in the first branch; and
closing at least one switch in the second branch.

20. The apparatus of claim 16, wherein the PLL associated with the second VCO is active in a carrier aggregation (CA) mode for the apparatus and wherein the second VCO is disconnected from the first VCO in the CA mode.

21. The apparatus of claim 13, wherein the PLL associated with the second VCO is idle in a multiple-input, multiple-output (MIMO) mode for the apparatus and wherein the second VCO is connected with the first VCO in the MIMO mode.

22. The apparatus of claim 13, wherein a portion of the PLL associated with the second VCO is powered off before the second VCO is connected with the first VCO.

23. The apparatus of claim 22, further comprising a PLL associated with the first VCO, wherein the PLL associated with the first VCO is used when the second VCO is connected with the first VCO.

24. The apparatus of claim 13, wherein the first VCO comprises a first tank circuit and a first active negative transconductance circuit, wherein the second VCO comprises a second tank circuit and a second active negative transconductance circuit, and wherein the first tank circuit is different from the second tank circuit.

* * * * *